United States Patent
Choi et al.

(10) Patent No.: US 10,804,353 B2
(45) Date of Patent: Oct. 13, 2020

(54) DISPLAY APPARATUS WITH VOLTAGE SENSING

(71) Applicant: Samsung Display Co., Ltd., Yongin-si (KR)

(72) Inventors: Junwon Choi, Yongin-si (KR); Wonmi Hwang, Yongin-si (KR); Junyong An, Yongin-si (KR); Yunkyeong In, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 29 days.

(21) Appl. No.: 16/251,087

(22) Filed: Jan. 18, 2019

(65) Prior Publication Data

US 2019/0378889 A1 Dec. 12, 2019

(30) Foreign Application Priority Data

Jun. 8, 2018 (KR) ........................ 10-2018-0066095

(51) Int. Cl.
*H01L 27/32* (2006.01)
*G09G 3/3258* (2016.01)
*G09G 3/3266* (2016.01)
*G09G 3/3291* (2016.01)

(52) U.S. Cl.
CPC ....... *H01L 27/3279* (2013.01); *G09G 3/3258* (2013.01); *G09G 3/3266* (2013.01); *G09G 3/3291* (2013.01); *H01L 27/3206* (2013.01)

(58) Field of Classification Search
CPC ............ H01L 27/3279; H01L 27/3206; G09G 3/3291; G09G 3/3266; G09G 3/3258
See application file for complete search history.

(56) References Cited

U.S. PATENT DOCUMENTS

| 8,952,954 B2 | 2/2015 | Kwon et al. |
| 9,589,510 B2 | 3/2017 | Lee et al. |
| 9,767,729 B2 | 9/2017 | Shin |

(Continued)

FOREIGN PATENT DOCUMENTS

| EP | 2639784 | 9/2013 |
| EP | 3226234 | 10/2017 |

(Continued)

OTHER PUBLICATIONS

Partial European Search Report dated May 7, 2019, issued in European Patent Application No. 19162422.0.

(Continued)

*Primary Examiner* — Joseph L Williams
(74) *Attorney, Agent, or Firm* — H.C. Park & Associates, PLC

(57) ABSTRACT

A display apparatus includes: a substrate having a display area, a peripheral area outside the display area, a pad area in the peripheral area, and a bending area between the display area and the pad area; a thin film transistor in the display area and an organic light-emitting device electrically connected to the thin film transistor; a first voltage line between a side of the display area and the pad area, in the peripheral area, the first voltage line supplying a first voltage to the organic light-emitting device; and a first sensing line in the peripheral area, the first sensing line measuring the first voltage of the first voltage line, wherein a first contact where an end of the first sensing line and the first voltage line are connected is between the bending area and the display area.

20 Claims, 7 Drawing Sheets

(56) References Cited

U.S. PATENT DOCUMENTS

| | | |
|---|---|---|
| 9,893,139 B2 | 2/2018 | Kim et al. |
| 2006/0170402 A1 | 8/2006 | Banerjee et al. |
| 2017/0287394 A1 | 10/2017 | Kim et al. |
| 2017/0287936 A1 | 10/2017 | Kim et al. |

FOREIGN PATENT DOCUMENTS

| | | |
|---|---|---|
| KR | 10-2015-0142144 | 12/2015 |
| KR | 10-2016-0020035 | 2/2016 |
| KR | 10-2017-0099036 | 8/2017 |
| KR | 10-2017-0114027 | 10/2017 |

OTHER PUBLICATIONS

Extended European Search Report dated Jul. 16, 2019, issued in European Patent Application No. 19162422.0.

DISPLAY APPARATUS WITH VOLTAGE SENSING

CROSS-REFERENCE TO RELATED APPLICATION

This application claims priority from and the benefit of Korean Patent Application No. 10-2018-0066095, filed on Jun. 8, 2018, which is hereby incorporated by reference for all purposes as if fully set forth herein.

BACKGROUND

Field

Exemplary embodiments/implementations of the invention relate generally to a display apparatus.

Discussion of the Background

Organic light-emitting display apparatuses have a high response rate and are driven with low power consumption. The organic light-emitting display apparatuses include a plurality of pixels. The pixels of the organic light-emitting display apparatuses that are operated by using an analog driving method may have brightness adjusted based on a magnitude of a voltage or a current that is input, to represent gradation, and the pixels of the organic light-emitting display apparatuses that are operated via a digital driving method may emit light having the same brightness and different emission times, to represent gradation.

Meanwhile, a voltage drop (or an IR drop) may occur in power lines supplying power to the pixels, due to resistance elements, etc. of the power lines, and thus, a value of a voltage that is input to the power lines and a value of a voltage actually supplied to the pixels may be different from each other. Thus, driving defects may occur in the organic light-emitting display apparatuses.

The above information disclosed in this Background section is only for understanding of the background of the inventive concepts, and, therefore, it may contain information that does not constitute prior art.

SUMMARY

One or more exemplary embodiments include a display apparatus configured to accurately measure an actual value of a voltage supplied to an organic light-emitting device.

Additional features of the inventive concepts will be set forth in the description which follows, and in part will be apparent from the description, or may be learned by practice of the inventive concepts.

According to one or more exemplary embodiments, a display apparatus includes: a substrate having a display area, a peripheral area outside the display area, a pad area in the peripheral area, and a bending area between the display area and the pad area; a thin film transistor in the display area and an organic light-emitting device electrically connected to the thin film transistor; a first voltage line between a side of the display area and the pad area, in the peripheral area, the first voltage line supplying a first voltage to the organic light-emitting device; and a first sensing line in the peripheral area, the first sensing line measuring the first voltage of the first voltage line, wherein a first contact where an end of the first sensing line and the first voltage line are connected is between the bending area and the display area.

The first voltage line may include a first main voltage line arranged to correspond to the side of the display area, and a first connection portion extending across the bending area from the first main voltage line toward the pad area, and the first contact may be in the first main voltage line.

The display apparatus may further include a second sensing line in the peripheral area, the second sensing line measuring the first voltage of the first voltage line at a location different from a location of the first sensing line.

An end of the second sensing line may be connected to the first voltage line to form a second contact, and the second contact may be more adjacent to an edge of the substrate than the first contact.

The second contact may be at an end of the first main voltage line.

The first sensing line may be apart from the first connection portion, may have the same shape as the first connection portion, and may extend from the first contact toward the pad area, in parallel to the first connection portion.

The display apparatus may further include a second voltage line in the peripheral area, the second voltage line supplying a second voltage to the organic light-emitting device, and the second voltage line may include a second main voltage line corresponding to both ends of the first main voltage line and surrounding the display area, except for the side of the display area, and a second connection portion protruding from an end of the second main voltage line and extending across the bending area.

The organic light-emitting device may include a pixel electrode, an opposite electrode, and an intermediate layer between the pixel electrode and the opposite electrode and comprising an emission layer, and the second voltage line may be electrically connected to the opposite electrode of the organic light-emitting device.

An inorganic insulating layer may be stacked on the substrate, the inorganic insulating layer may include a groove, which is formed by removing a portion of the inorganic insulating layer at a location corresponding to the bending area, an organic material layer may be in the groove, and the first sensing line may be on the organic material layer in the bending area.

The thin film transistor may include a semiconductor layer, a gate electrode, a source electrode, and a drain electrode, and the first sensing line may be on the same layer as the source electrode and the drain electrode of the thin film transistor.

According to one or more exemplary embodiments, a display apparatus includes: a substrate having a display area, a peripheral area outside the display area, a pad area in the peripheral area, and a bending area between the display area and the pad area; a first voltage line in the peripheral area, the first voltage line being provided between a side of the display area and the pad area; a second voltage line surrounding the display area, except for the side of the display area; and a first sensing line in the peripheral area, the first sensing line measuring a first voltage of the first voltage line, wherein the first voltage line is connected to an end of the first sensing line to form a first contact, and the first contact is more adjacent to the display area than the bending area.

A thin film transistor and a display device electrically connected to the thin film transistor may be in the display area, the thin film transistor may include a semiconductor layer, a gate electrode, a source electrode, and a drain electrode, and the first sensing line and the first voltage line may be on the same layer as the source electrode and the drain electrode of the thin film transistor.

The first voltage line may include a first main voltage line arranged to correspond to the side of the display area, and a first connection portion extending across the bending area from the first main voltage line toward the pad area, and the first contact may be in the first main voltage line.

The display apparatus may further include a second sensing line in the peripheral area, the second sensing line measuring the first voltage of the first voltage line at a location different from a location of the first sensing line, and an end of the second sensing line may be connected to the first voltage line to form a second contact at a location different from a location of the first contact.

The second contact may be more adjacent to an edge of the substrate than the first contact.

The second contact may be at an end of the first main voltage line.

The second sensing line may be more adjacent to the second voltage line than to the first voltage line and may extend from the second contact toward the pad area in parallel to the second voltage line.

A thin film transistor and a display device electrically connected to the thin film transistor may be in the display area, the display device may include a pixel electrode, an opposite electrode, and an intermediate layer between the pixel electrode and the opposite electrode and including an emission layer, and the second voltage line may be electrically connected to the opposite electrode of the display device.

A first thin film transistor, a second thin film transistor, and the display device electrically connected to the second thin film transistor may be in the display area, an interlayer insulating layer, a first planarization insulating layer, and a second planarization insulating layer may be between the first and second thin film transistors and the display device, a data line and a driving voltage line which are at respective layers different from each other and have the first planarization insulating layer therebetween may be between the first and second thin film transistors and the display device, the data line may provide a data signal to the first thin film transistor, and the driving voltage line may provide a driving signal to the second thin film transistor, and the first sensing line may be on the same layer as the driving voltage line.

An inorganic insulating layer may be stacked on the substrate, the inorganic insulating layer including a groove, which is formed by removing a portion of the inorganic insulating layer at a location corresponding to the bending area, an organic material layer may be in the groove, and the first sensing line may be on the organic material layer in the bending area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
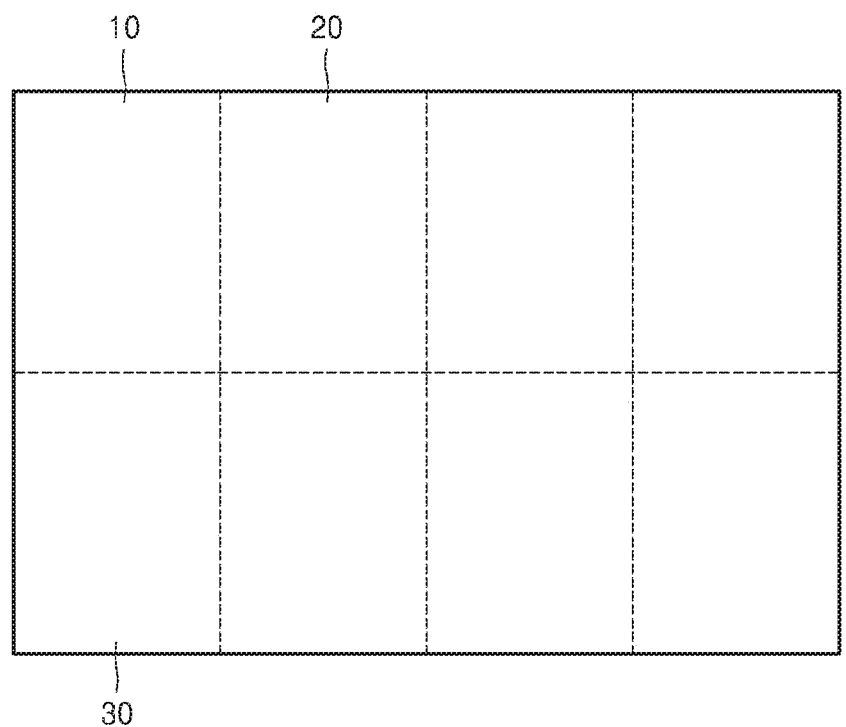
FIG. 1 is a schematic plan view for describing a process of manufacturing a display apparatus according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
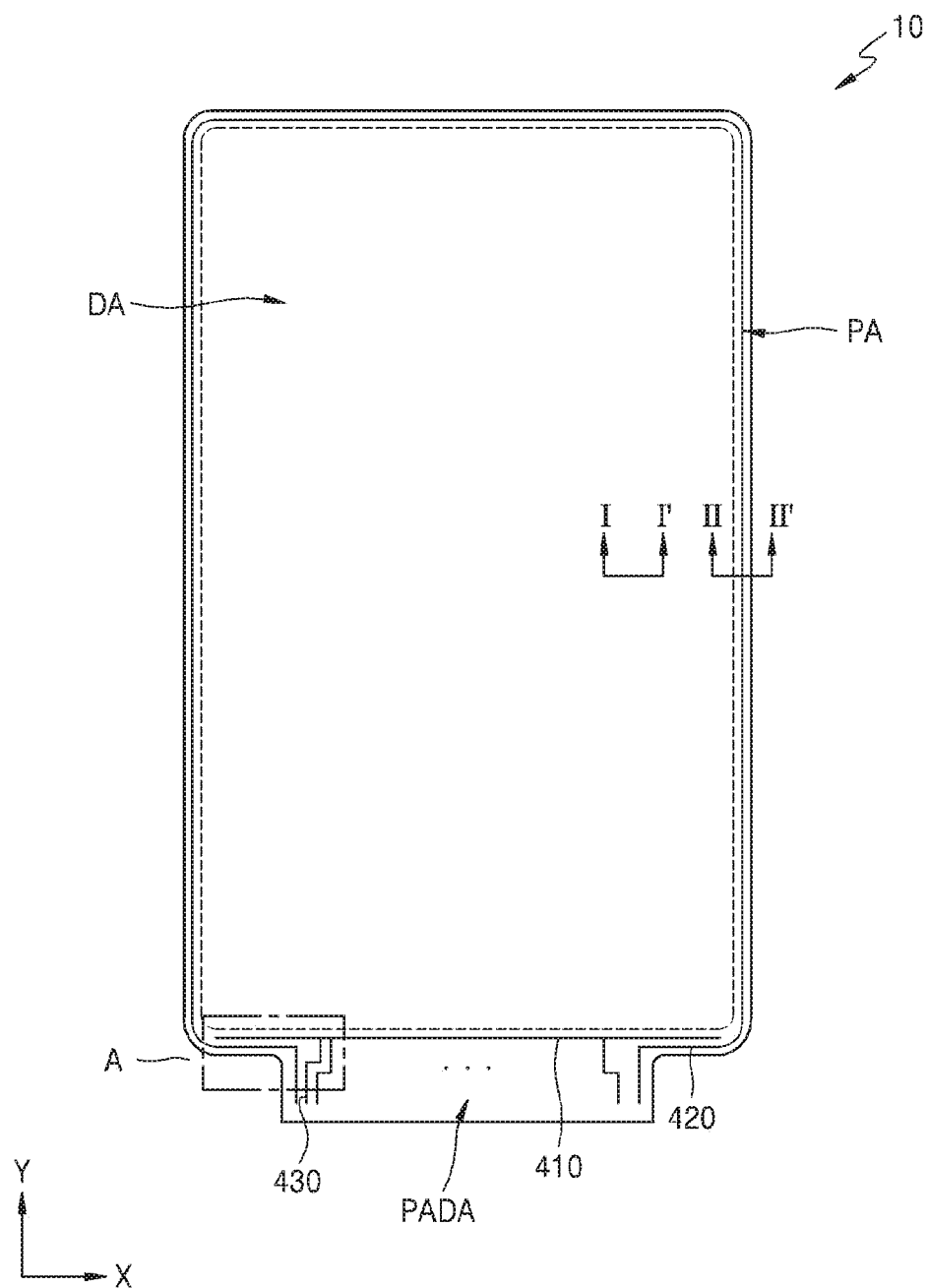
FIG. 2 is a schematic plan view of an example of a display apparatus according to an exemplary embodiment.
Figure 3:
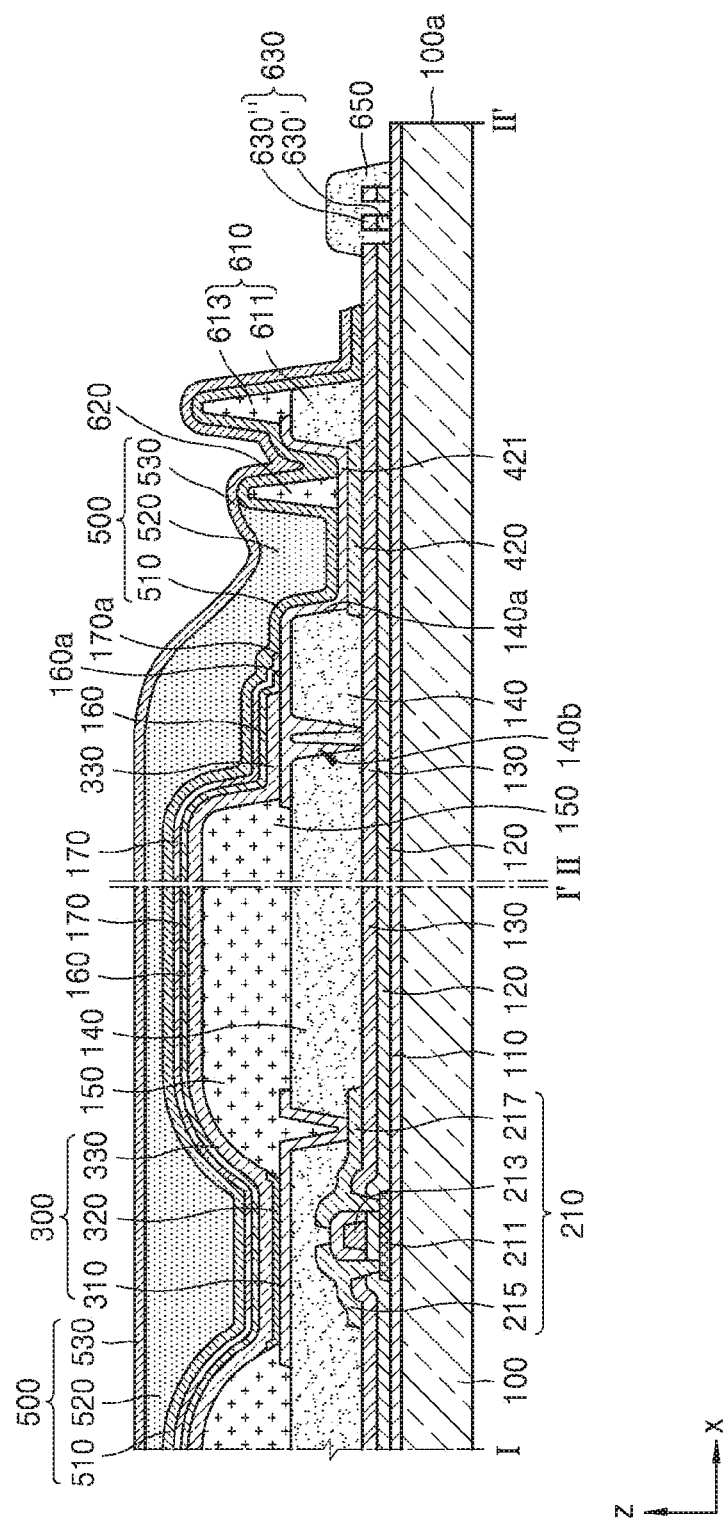
FIG. 3 is a schematic cross-sectional view of an example of a section I-I' and an example of a section II-II' of FIG. 2.

FIG. 1 is a schematic plan view for describing a process of manufacturing a display apparatus according to an exemplary embodiment. FIG. 2 is a schematic plan view of an example of the display apparatus manufactured by using the process described above. FIG. 3 is a schematic cross-sectional view of an example of a section I-I' and an example of a section II-II' of FIG. 2.

As illustrated in FIG. 1, when manufacturing a display apparatus, a number of display apparatuses 10, 20, and 30 are simultaneously manufactured. For example, a plurality of displays are formed on a large mother substrate and the substrate is cut to obtain the plurality of display apparatuses 10, 20, and 30.

FIG. 2 is a schematic plan view of an example of the display apparatus 10 manufactured by using the process described above, and the display apparatus 10 may include a display area DA for displaying an image, and a peripheral area PA outside the display area DA. This may indicate that a substrate 100 (of FIG. 3) has the display area DA and the peripheral area PA.

A display device may be arranged in the display area DA. The peripheral area PA may include a pad area PADA, to which various electronic devices, printed circuit boards, etc. are electrically connected, and first and second voltage lines 410 and 420 may be arranged in the peripheral area PA. Also, a first sensing line 430 configured to measure a voltage of any one of the first and second voltage lines 410 and 420 in real time may be arranged in the peripheral area PA.

In addition, FIG. 2 may be understood as the plan view of a shape of the substrate 100, etc., during the process in which the display apparatus 10 is manufactured. In the manufactured display apparatus 10, or an electronic apparatus, such as a smartphone, which includes the display apparatus 10, a portion of the substrate 100, etc. may be bent to minimize an area of the peripheral PA recognized by a user. For example, the substrate 100 may be bent between the pad area PADA and the display area DA so that at least a portion of the pad area PADA overlaps the display area DA. A bending direction may be set such that the pad area PADA is behind the display area DA, while not covering the display area DA. Thus, the user may recognize that the display apparatus 10 mainly includes the display area DA.

Also, the substrate 100, etc. may be bent such that right and left edges of the display area DA have a convex shape protruding toward the outside. Thus, from the front of the display apparatus 10, both edges of the display apparatus 10 may be recognized to have no bezel, and the effect of enlarging the display area DA may be obtained.

FIG. 3 is a schematic cross-sectional view of a portion of the display apparatus 10 of FIG. 2, wherein the display apparatus 10 is an organic light-emitting display apparatus including an organic light-emitting device 300. However, exemplary embodiments are not limited thereto, and the display apparatus 10 may include other types of display devices, such as a liquid crystal device, etc.

The substrate 100 may include polymer resins, such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). However, in addition thereto, various modifications are possible. For example, the substrate 100 may include a metal, etc.

A thin film transistor 210 may be arranged in the display area DA of the substrate 100. In addition to the thin film transistor 210, a display device electrically connected to the thin film transistor 210 may be arranged in the display area DA of the substrate 100. FIG. 3 illustrates the organic light-emitting device 300 as a display device. That the organic light-emitting device 300, which is a display device, is electrically connected to the thin film transistor 210 may also indicate that a pixel electrode 310 included in the organic light-emitting device 300 is electrically connected to the thin film transistor 210. However, a thin film transistor (not shown) may also be arranged in the peripheral area PA of the substrate 100. The thin film transistor arranged in the peripheral area PA may be a portion of a circuit unit for controlling an electrical signal applied, for example, to the display area DA.

The thin film transistor 210 may include a semiconductor layer 211 including amorphous silicon, polycrystalline silicon, or an organic semiconductor material, a gate electrode 213, a source electrode 215, and a drain electrode 217. A buffer layer 110 including an inorganic material, such as silicon oxide, silicon nitride, or silicon oxynitride, may be arranged on the substrate 100 to planarize a surface of the substrate 100 or prevent penetration of impurities, etc., into the semiconductor layer 211. The semiconductor layer 211 may be on the buffer layer 110.

The gate electrode 213 may be arranged above the semiconductor layer 211, and the source electrode 215 and the drain electrode 217 may be electrically connected to each other according to a signal applied to the gate electrode 213. The gate electrode 213 may include, for example, one or more materials from Al, Pt, Pd, Ag, Mg, Au, Ni, Nd, Ir, Cr, Li, Ca, Mo, Ti, W, and Cu, and may have a single-layered or a multiple-layered structure. Here, to obtain an insulating property between the semiconductor layer 211 and the gate electrode 213, a gate insulating layer 120 including an inorganic material, such as silicon oxide, silicon nitride, or silicon oxynitride, may be between the semiconductor layer 211 and the gate electrode 213.

An interlayer insulating layer 130 may be arranged above the gate electrode 213 and may be formed to have a single-layered or a multiple-layered structure including an inorganic material, such as silicon oxide, silicon nitride, or silicon oxynitride.

The source electrode 215 and the drain electrode 217 may be arranged above the interlayer insulating layer 130. Each of the source electrode 215 and the drain electrode 217 may be electrically connected to the semiconductor layer 211, via a contact hole formed in the interlayer insulating layer 130 and the gate insulating layer 120. The source electrode 215 and the drain electrode 217 may include, for example, one or more materials from Al, Pt, Pd, Ag, Mg, Au, Ni, Nd, Ir, Cr, Li, Ca, Mo, Ti, W, and Cu, by taking conductivity into account, etc., and may have a single-layered or a multiple-layered structure.

In order to protect the thin film transistor 210 having this structure, a protection layer (not shown) covering the thin film transistor 210 may be arranged. The protection layer may include an inorganic material, such as silicon oxide, silicon nitride, or silicon oxynitride. The protection layer may include a single layer or multiple layers.

A planarization layer 140 may be arranged on the protection layer. For example, when the organic light-emitting device 300 is arranged above the thin film transistor 210 as illustrated in FIG. 3, the planarization layer 140 may generally planarize an upper portion of the protection layer covering the thin film transistor 210. The planarization layer 140 may include an organic material, such as acryl, benzocyclobutene (BCB), or hexamethyldisiloxane (HMDSO). FIG. 3 illustrates that the planarization layer 140 includes a single layer. However, various modifications are possible. For example, the planarization layer 140 may include multiple layers. The display apparatus 10 according to the present exemplary embodiment may have both the protection layer and the planarization layer 140, or may have only the planarization layer 140 when necessary.

In the display area DA of the substrate 100, the organic light-emitting device 300 may be arranged on the planarization layer 140, the organic light-emitting device 300 including the pixel electrode 310, an opposite electrode 330, and an intermediate layer 320 between the pixel electrode 310 and the opposite electrode 330 and including an emission layer.

There may be an opening in the planarization layer 140 to expose at least one of the source electrode 215 and the drain electrode 217 of the thin film transistor 210. The pixel electrode 310 electrically connected to the thin film transistor 210 by contacting any one of the source electrode 215 and the drain electrode 217 via the opening may be arranged on the planarization layer 140. The pixel electrode 310 may be a transparent electrode, a semi-transparent electrode, a transflective electrode, or a reflective electrode. When the pixel electrode 310 is a transparent, transflective, or a semi-transparent electrode, the pixel electrode 310 may include, for example, ITO, IZO, ZnO, $In_2O_3$, IGO, or AZO. When the pixel electrode 310 is a transflective or reflective electrode, the pixel electrode 310 may include a reflection layer including Ag, Mg, Al, Pt, Pd, Au, Ni, Nd, Ir, Cr, or a compound thereof, and a layer including ITO, IZO, ZnO, $In_2O_3$, IGO, or AZO. However, exemplary embodiments are not limited thereto, and various modifications are possible. For example, the pixel electrode 310 may include various materials, and may have a single-layered structure or a multiple-layered structure.

A pixel-defining layer 150 may be arranged above the planarization layer 140. The pixel-defining layer 150 may define a pixel by having an opening corresponding to each sub-pixel, that is, an opening to expose at least a central portion of the pixel electrode 310. Also, in the case of FIG. 3, the pixel-defining layer 150 may increase a distance between an edge of the pixel electrode 310 and the opposite electrode 330 above the pixel electrode 310, thereby preventing an arc, etc., from occurring at the edge of the pixel electrode 310. The pixel-defining layer 150 may include an organic material, such as PI or HMDSO.

The intermediate layer 320 of the organic light-emitting device 300 may include a low molecular-weight material or a high molecular-weight material. When the intermediate layer 320 includes a low molecular-weight material, the intermediate layer 320 may have a structure in which a hole injection layer (HIL), a hole transport layer (HTL), an emission layer (EML), an electron transport layer (ETL), and/or an electron injection layer (EIL) are stacked, and may include various organic materials, such as copper phthalocyanine (CuPc), N,N'-Di (naphthalene-1-yl)-N,N'-diphenyl-benzidine, tris-8-hydroxyquinoline aluminum (Alq3), etc. The HIL, the HTL, the EML, the ETL, and the EIL may be formed by using a vapor deposition method.

When the intermediate layer 320 includes a high molecular-weight material, the intermediate layer 320 may have a structure including, for example, an HTL and an EML. Here, the HTL may include PEDOT, and the EML may include a polymer material, such as a poly-phenylenevinylene (PPV)-based polymer material and a polyfluorene-based polymer material. The intermediate layer 320 may be formed by using a screen print method, an inkjet print method, a laser induced thermal imaging (LITI) method, etc.

However, the intermediate layer 320 is not necessarily limited thereto, and may have various structures.

The opposite electrode 330 may be arranged above the display area DA to cover the display area DA. That is, the opposite electrode 330 may be integrally formed throughout a plurality of organic light-emitting devices 300 to correspond to the plurality of pixel electrodes 310. The opposite electrode 330 may be a transparent electrode, semi-transparent electrode, transflective electrode, or a reflective electrode. When the opposite electrode 330 is a semi-transparent electrode or transflective electrode, the opposite electrode 330 may have a layer including a metal having a low work function, such as Li, Ca, LiF/Ca, LiF/Al, Al, Ag, Mg, or a compound thereof, and a transparent or semi-transparent conductive layer including ITO, IZO, ZnO, or $In_2O_3$. When the opposite electrode 330 is a reflective electrode, the opposite electrode 330 may have a layer including Li, Ca, LiF/Ca, LiF/Al, Al, Ag, Mg, or a compound thereof. However, structures and materials of the opposite electrode 330 are not limited thereto, and various modifications are possible.

A display device, such as the organic light-emitting device 300, includes the opposite electrode 330, and to display an image, a pre-set electrical signal has to be applied to the opposite electrode 330. Thus, a second voltage line 420 may be arranged in the peripheral area PA to transmit the pre-set electrical signal to the opposite electrode 330. The second voltage line 420 may be a second voltage (ELVSS) line.

The second voltage line 420 may be simultaneously formed with various conductive layers in the display area DA by including the same material as the conductive layers. FIG. 3 illustrates that the source electrode 215 and the drain electrode 217 of the thin film transistor 210 in the display area DA are arranged on the interlayer insulating layer 130 and the second voltage line 420 in the peripheral area PA is also arranged on the interlayer insulating layer 130. This may indicate that when the source electrode 215 and the drain electrode 217 of the thin film transistor 210 in the display area DA are formed on the interlayer insulating layer 130, the second voltage line 420 may be simultaneously formed on the interlayer insulating layer 130 in the peripheral area PA with the source electrode 215 and the drain electrode 217, by including the same material as the source electrode 215 and the drain electrode 217. Accordingly, the second voltage line 420 may have the same structure as the source electrode 215 and the drain electrode 217. However, exemplary embodiments are not limited thereto, and various modifications are possible. For example, the second voltage line 420 may be simultaneously formed on the gate insulating layer 120 with the gate electrode 213 by including the same material as the gate electrode 213.

The opposite electrode 330 may directly contact the second voltage line 420 or may be electrically connected to the second voltage line 420 via a protective conductive layer 421 as illustrated in FIG. 3. The protective conductive layer 421 may be arranged on the planarization layer 140 and may extend onto the second voltage line 420 to be electrically connected to the second voltage line 420. Accordingly, the opposite electrode 330 may contact the protective conductive layer 421 in the peripheral area PA, and the protective conductive layer 421 may also contact the second voltage line 420 in the peripheral area PA.

Since the protective conductive layer 421 is arranged on the planarization layer 140 as illustrated in FIG. 3, the protective conductive layer 421 may be simultaneously formed with components on the planarization layer 140 in the display area DA by including the same material as the components. In detail, when the pixel electrode 310 in the display area DA is formed on the planarization layer 140, the protective conductive layer 421 may be formed on the planarization layer 140 in the peripheral area PA, simultaneously with the pixel electrode 310, by including the same material as the pixel electrode 310. Accordingly, the protective conductive layer 421 may have the same structure as the pixel electrode 310. As illustrated in FIG. 3, the protective conductive layer 421 may not be covered by the planarization layer 140 and may cover an exposed portion of the second voltage line 420. Via this, damage to the second voltage line 420 exposed to the planarization layer 140, in a process of forming a first limit dam 610 or a second limit dam 620, may be prevented.

In addition, in order to prevent impurities, such as external oxygen or water, from penetrating into the display area DA through the planarization layer 140, the planarization layer 140 may have an opening 140b in the peripheral area PA, as illustrated in FIG. 3. Also, when the protective conductive layer 421 is formed, the protective conductive layer 421 may fill the opening 140b. Via this, impurities having penetrated into the planarization layer 140 in the peripheral area PA may be effectively prevented from penetrating into the planarization layer 140 in the display area DA.

A capping layer 160 for increasing an efficiency of light generated from the organic light-emitting device 300 may be on the opposite electrode 330. The capping layer 160 may cover the opposite electrode 330 and may extend to the outside of the opposite electrode 330 to contact the protective conductive layer 421 below the opposite electrode 330. The opposite electrode 330 may cover the display area DA and extend to the outside of the display area DA, and thus, the capping layer 160 may also cover the display area DA and extend to the peripheral area PA outside the display area DA. The capping layer 160 may include an organic material.

As described above, the capping layer 160 may increase the efficiency of the light generated from the organic light-emitting device 300. For example, the capping layer 160 may improve an optical extraction efficiency. It is desirable that this improvement of the optical extraction efficiency via the capping layer 160 be uniform in the display area DA. By taking this aspect into account, it is desirable that the capping layer 160 have an upper surface corresponding to a curve of an upper surface of a layer below the capping layer 160. That is, as illustrated in FIG. 3, the upper surface of a portion of the capping layer 160, the portion being on the opposite electrode 330, may have a shape corresponding to a curve of an upper surface of the opposite electrode 330.

An encapsulation layer 500 may be above the capping layer 160. The encapsulation layer 500 may protect the organic light-emitting device 300 from water or oxygen from the outside. To this end, the encapsulation layer 500 may have a shape extending not only the display area DA in which the organic light-emitting device 300 is arranged, but also to the peripheral area PA outside the display area DA. The encapsulation layer 500 may have a multi-layered structure, as illustrated in FIG. 3. In detail, the encapsulation layer 500 may include a first inorganic encapsulation layer 510, an organic encapsulation layer 520, and a second inorganic encapsulation layer 530.

The first inorganic encapsulation layer 510 may cover the capping layer 160 and may include silicon oxide, silicon nitride, and/or silicon oxynitride. The first inorganic encapsulation layer 510 may be formed along a structure therebelow, and thus, an upper surface of the first inorganic encapsulation layer 510 may not be flat, as illustrated in FIG. 3. The organic encapsulation layer 520 may cover the first inorganic encapsulation layer 510 and may have a sufficient thickness, and thus, an upper surface of the organic encapsulation layer 520 may be substantially flat throughout the display area DA. The organic encapsulation layer 520 may include one or more materials selected from the group consisting of PET, PEN, PC, PI, polyethylene sulfonate, polyoxymethylene, polyarylate, and HMDSO. The second inorganic encapsulation layer 530 may cover the organic encapsulation layer 520 and may include silicon oxide, silicon nitride, and/or silicon oxynitride. The second inorganic encapsulation layer 530 may extend outside the organic encapsulation layer 520 to contact the first inorganic encapsulation layer 510, so that the organic encapsulation layer 520 may not be exposed to the outside.

Since the encapsulation layer 500 may include the first inorganic encapsulation layer 510, the organic encapsulation layer 520, and the second inorganic encapsulation layer 530, even if cracks occur in the encapsulation layer 500, via this multi-layered structure, the cracks may not be connected between the first inorganic encapsulation layer 510 and the organic encapsulation layer 520 or between the organic encapsulation layer 520 and the second inorganic encapsulation layer 530. Thus, forming of a path through which water or oxygen from the outside penetrates into the display area DA may be prevented or minimized.

In a process of forming the encapsulation layer 500, structures below the encapsulation layer 500 may be damaged. For example, the first inorganic encapsulation layer 510 may be formed by using a chemical vapor deposition (CVD) method, and when the first inorganic encapsulation layer 510 is formed by using the CVD method, a layer directly below the first inorganic encapsulation layer 510 may be damaged. Thus, when the first inorganic encapsulation layer 510 is formed directly on the capping layer 160, the capping layer 160 for increasing the efficiency of the light generated from the organic light-emitting device 300 may be damaged and thus degrade the optical efficiency of the display apparatus 10. Thus, in order to prevent the damage to the capping layer 160 in the process of forming the encapsulation layer 500, a protection layer 170 may be between the capping layer 160 and the encapsulation layer 500. The protection layer 170 may include LiF.

As described above, the capping layer 160 may extend not only to the display area DA, but also to the peripheral area PA outside the display area DA. Accordingly, the protection layer 170 may extend outside the capping layer 160 so that the capping layer 160 and the encapsulation layer 500 may not directly contact each other. In this case, the protection layer 170 may cover a distal end 160*a* of the capping layer 160 so that a distal end 170*a* of the protection layer 170 may be on the planarization layer 140. In detail, as illustrated in FIG. 3, the distal end 170*a* of the protection layer 170 may directly contact the protective conductive layer 421 on the planarization layer 140.

The first inorganic encapsulation layer 510, which is a lowermost or bottom layer of the encapsulation layer 500, may adhere better to a layer including an inorganic material than to a layer including an organic material. Since the capping layer 160 may include an organic material as described above, adhesion between the capping layer 160 and the first inorganic encapsulation layer 510 may be less than adhesion between the protection layer 170 including an inorganic material, such as LiF, and the first inorganic encapsulation layer 510. Therefore, in the case of the display apparatus 10 according to the present exemplary embodiment, good adhesion between the encapsulation layer 500 and a layer below the encapsulation layer 500 may be secured, to effectively prevent or minimize the detachment of the encapsulation layer 500 from the layer below the encapsulation layer 500 in the process of manufacturing the encapsulation layer 500 or in the process of using the encapsulation layer 500 after the encapsulation layer 500 is manufactured.

In addition, when forming the encapsulation layer 500, specifically when forming the organic encapsulation layer 520, a material for forming the organic encapsulation layer 520 should be limited to being disposed in a pre-set area. To this end, the first limit dam 610 may be disposed in the peripheral area PA, as illustrated in FIG. 3. In detail, in addition to the buffer layer 110, the gate insulating layer 120, and the interlayer insulating layer 130, the planarization layer 140 may be arranged in the peripheral area PA, in addition to the display area DA of the substrate 100, as illustrated in FIG. 3. The first limit dam 610 may be arranged in the peripheral area PA to be apart from the planarization layer 140.

The first limit dam 610 may have a multi-layered structure. That is, the first limit dam 610 may include a first layer 611 and a second layer 613 in a direction away from the substrate 100. The first layer 611 may be simultaneously formed with the planarization layer 140 in the display area DA by including the same material as the planarization layer 140, and the second layer 613 may be simultaneously formed with the pixel-defining layer 150 in the display area DA by including the same material as the pixel-defining layer 150.

However, as illustrated in FIG. 3, in addition to the first limit dam 610, there may be a second limit dam 620 between the first limit dam 610 and a distal end 140*a* of the planarization layer 140. The second limit dam 620 may be arranged on a portion of the protective conductive layer 421, the portion being on the second voltage line 420. The second limit dam 620 may also be arranged in the peripheral area PA to be apart from the planarization layer 140. The second limit dam 620 may also have a multi-layered structure, like the first limit dam 610, and may include a less number of layers than the first limit dam 610 to have a less height from the substrate 100 than the first limit dam 610. FIG. 3 illustrates that the second limit dam 620 may be simultaneously formed with the second layer 613 of the first limit dam 610 by including the same material as the second layer 613 of the first limit dam 610.

The first inorganic encapsulation layer 510 of the encapsulation layer 500 may be formed by using the CVD method, may cover the second limit dam 620 and the first limit dam 610, and may extend outside the first limit dam 610, as illustrated in FIG. 3. A location of the organic encapsulation layer 520 on the first inorganic encapsulation layer 510 may be limited by the second limit dam 620, and thus, the material for forming the organic encapsulation layer 520 may be prevented from flowing over to the outside of the second limit dam 620, when the organic encapsulation layer 520 is formed. Even if the material for forming the organic encapsulation layer 520 partially flows over to the outside of the second limit dam 620, the location of the organic encapsulation layer 520 may be limited by the first limit dam 610 so that the material for forming the organic encapsulation layer 520 may not further move in a direction toward the edge 100a of the substrate 100.

In addition, a crack prevention dam 630 may be arranged in the peripheral area PA as illustrated in FIG. 3. The crack prevention dam 630 may extend along at least a portion of the edge 100a of the substrate 100. That is, the crack prevention dam 630 may have a shape encircling the display area DA. However, in some sections, the crack prevention dam 630 may have a discontinuous shape. The crack prevention dam 630 may prevent cracks, which may be generated in the gate insulating layer 120 and the interlayer insulating layer 130 including an inorganic material, due to shocks, etc., during cutting of a mother substrate when the display apparatus 10 is manufactured as described with reference to FIG. 1, or during using of the display apparatus 10, from being transmitted to the display area DA.

The crack prevention dam 630 may have various shapes. As illustrated in FIG. 3, the crack prevention dam 630 may be simultaneously formed with some components formed in the display area DA by including the same materials as those components and may have a multi-layered structure. FIG. 3 illustrates that the crack prevention dam 630 may have the multi-layered structure including a lower layer 630' and an upper layer 630" above the lower layer 630'. In detail, FIG. 3 illustrates that the crack prevention dam 630 may include the lower layer 630' including the same material as the gate insulating layer 120, and the upper layer 630" including the same material as the interlayer insulating layer 130 on the gate insulating layer 120. The crack prevention dam 630 may be arranged on the buffer layer 110. However, the crack prevention dam 630 may be arranged on a layer below the buffer layer 110 and may include a layer including the same material as the buffer layer 110 when necessary. Also, as illustrated in FIG. 3, there may not be a single crack prevention dam 630. Rather, there may be a plurality of crack prevention dams 630 apart from each other.

The crack prevention dam 630 may be understood to be formed by removing portions of the gate insulating layer 120 and the interlayer insulating layer 130. That is, as illustrated in FIG. 3, at least a side of the crack prevention dam 630 may have a groove formed by removing the gate insulating layer 120 and the interlayer insulating layer 130, and the crack prevention dam 630 may include remaining portions of the gate insulating layer 120 and the interlayer insulating layer 130 adjacent to the groove.

The crack prevention dam 630 may be covered by a covering layer 650 as illustrated in FIG. 3. The covering layer 650 may be, for example, simultaneously formed with the planarization layer 140 in the display area DA, by including the same material as the planarization layer 140. That is, the covering layer 650 may be formed by including an organic material covering the crack prevention dam 630 including an inorganic material. The covering layer 650 may cover distal ends of the gate insulating layer 120 and/or the interlayer insulating layer 130, the distal ends being in a direction toward the edge 100a of the substrate 100, and may also cover the crack prevention dam 630.

Figure 4:
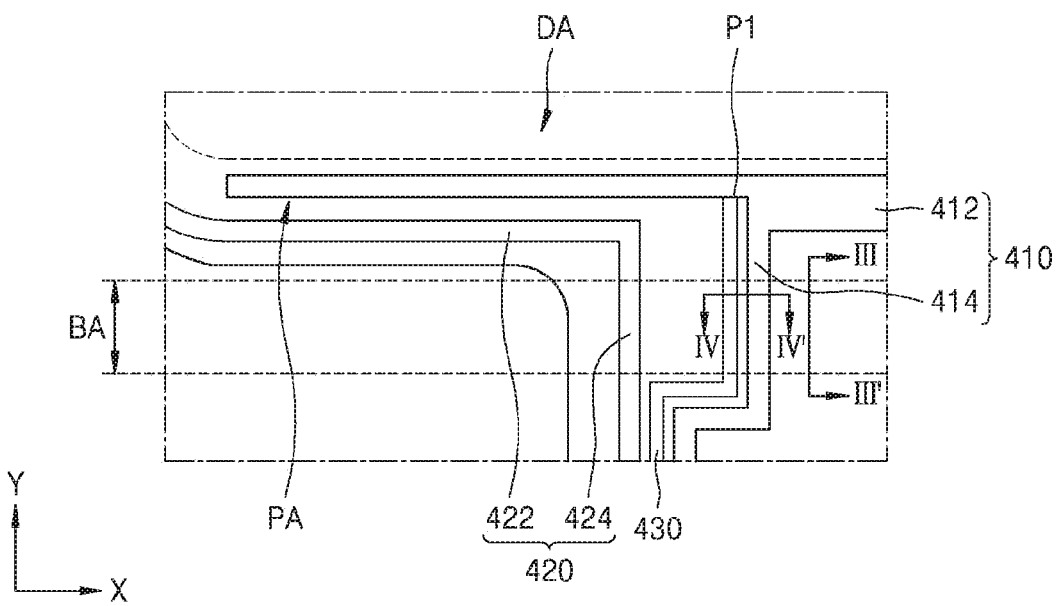
FIG. 4 is a schematic plan view of an example of a region A of FIG. 2.
Figure 5:
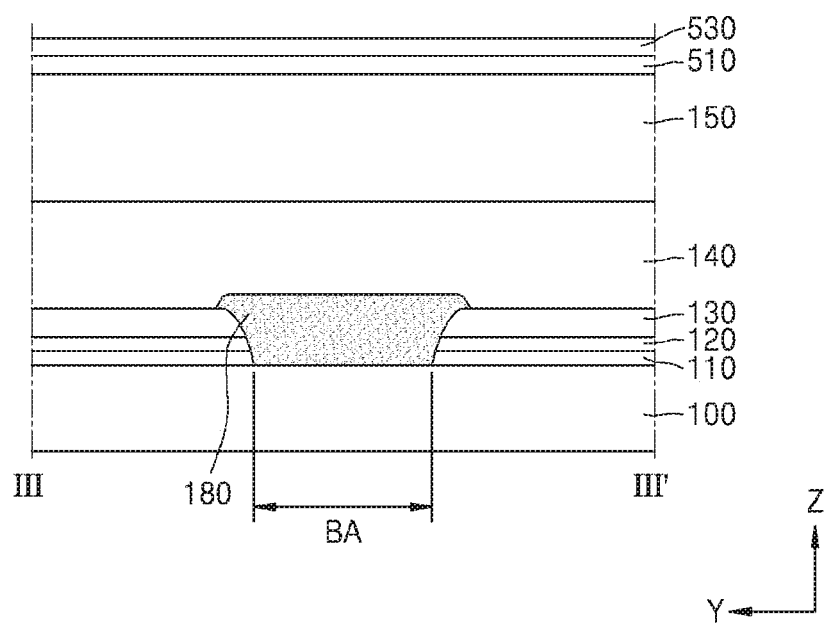
FIG. 5 is a schematic cross-sectional view of an example of a section of FIG. 4.
Figure 6:
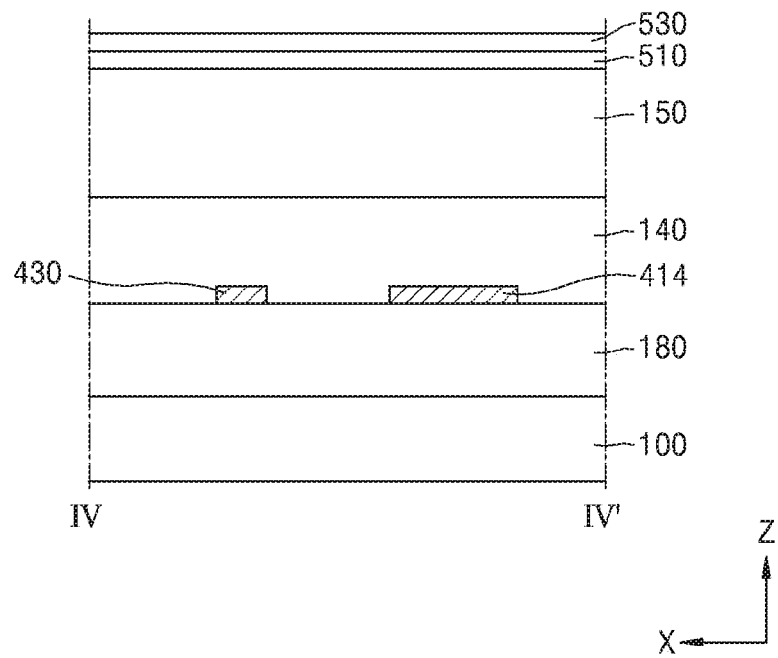
FIG. 6 is a schematic cross-sectional view of an example of a section IV-IV' of FIG. 4.

FIG. 4 is a schematic plan view of an example of a region A of FIG. 2, FIG. 5 is a schematic cross-sectional view of an example of a section of FIG. 4, and FIG. 6 is a schematic cross-sectional view of an example of a section IV-IV' of FIG. 4.

Referring to FIGS. 4 through 6, the peripheral area PA of the substrate 100 may include a bending area BA between the pad area PADA and the display area DA, and the first voltage line 410 and the second voltage line 420 supplying driving power to the organic light-emitting device 300 (FIG. 3), and a first sensing line 430 for measuring a voltage of at least the first voltage line 410 may be arranged in the peripheral area PA.

The bending area BA may be an area of the substrate 100, from which portions of the buffer layer 110, the gate insulating layer 120, and the interlayer insulating layer 130 are removed. That is, it may be understood that the inorganic insulating layers, such as the buffer layer 110, the gate insulating layer 120, and the interlayer insulating layer 130 stacked on the substrate 100, include a groove at an area corresponding to the bending area BA. Like this, since the portions of the inorganic insulating layers such as the buffer layer 110, the gate insulating layer 120, and the interlayer insulating layer 130 are removed from the bending area BA, the bending area BA may be easily bent, cracks, etc. may be prevented from occurring in the inorganic insulating layers during the bending. According to another exemplary embodiment, portions of the gate insulating layer 120 and the interlayer insulating layer 130 may be removed from the bending area BA, and the buffer layer 110 may not be removed from the bending area BA.

An organic material layer 180 may be arranged in the bending area BA. The organic material layer 180 may be filled in the bending area BA and may extend to a non-bending area adjacent to the bending area BA. The organic material layer 180 may compensate for a step difference of the bending area BA and may absorb stress generated due to bending. Thus, stress concentration in various connection wires on the bending area BA, due to bending for transmission of electrical signals from a pad portion (not shown) on the pad area PADA to the display area DA, may be effectively minimized.

The organic material layer 180 may include at least one of acryl, methacryl, polyester, polyethylene, polypropylene, PET, PEN, PC, PI, polyethylene sulfonate, polyoxymethylene, polyarylate, and HMDSO.

In addition, the planarization layer 140 and the pixel-defining layer 150 may extend on the peripheral area PA including the bending area BA, and the first inorganic encapsulation layer 510 and the second inorganic encapsulation layer 530 may be formed on the pixel-defining layer 150. Also, an additional protection layer may further be arranged on the second inorganic encapsulation layer 530 in order to form a neutral plane on a location of wires on the bending area BA.

The first voltage line 410 may be a first voltage (ELVDD) line and the second voltage line 420 may be an ELVSS line. The second voltage line 420 may be connected to the opposite electrode 330 (FIG. 3) directly or through other wires.

The first voltage line 410 may be arranged between a side of the display area DA and the pad area PADA, and the second voltage line 420 may surround the display area DA, except for the side of the display area DA. The first voltage line 410 may be simultaneously formed with various conductive layers in the display area DA, by including the same material as the conductive layers, like the second voltage line 420. For example, the first voltage line 410 may have the same structure as the source electrode 215 (FIG. 3) and the drain electrode 217 (FIG. 3).

The first voltage line 410 may include a first main voltage line 412 arranged to correspond to the side of the display area DA and a first connection portion 414. For example, when the display area DA is approximately rectangular, the first main voltage line 412 may be arranged to correspond to any one side of the display area DA. The first main voltage line 412 may be in parallel to the side of the display area DA, and this side corresponding to the first main voltage line 412 may be adjacent to the pad area PADA. The first connection portion 414 may protrude from the first main voltage line 412 and may extend across the bending area BA to be connected to a pad portion (not shown).

The second voltage line 420 may include a second main voltage line 422 corresponding to both ends of the first main voltage line 412 and surrounding the display area DA, except for the side of the display area DA, and a second connection portion 424 protruding from an end of the second main voltage line 422 and extending across the bending area BA. The second connection portion 424 may be connected to the pad portion.

The first sensing line 430 may be connected to the first voltage line 410 and may measure a voltage of the first voltage line 410. A value of the voltage of the first voltage line 410, measured by the first sensing line 430, may be transmitted to the pad portion, and a value of a voltage input to the first voltage line 410 may be changed according to a change of the value of the voltage of the first voltage line 410, measured by the first sensing line 430.

A first contact P1 where an end of the first sensing line 430 and the first voltage line 410 are connected may be between the bending area BA and the display area DA. That is, the first contact P1 may be more adjacent to the display area DA than the bending area BA. In detail, the first contact P1 may be in the first main voltage line 412. Like this, the first contact P1 is adjacent to the display area DA, and thus, a value of the ELVDD, actually supplied to the display area DA, may be relatively more accurately measured. In other words, a voltage drop (or an IR drop) due to the first voltage line 410 may be accurately taken into account so that the value of the voltage input to the first voltage line 410 may be accurately calculated. Thus, a driving defect, which may be caused by a difference between the voltage actually supplied from the first voltage line 410 to the display area PA and a voltage needed to drive the organic light-emitting device 300 (FIG. 3), may be prevented.

In addition, the first sensing line 430 may be on the same layer as the first voltage line 410. Thus, the first sensing line 430 may have the same structure as the source electrode 215 (FIG. 3) and the drain electrode 217 (FIG. 3). Also, the first sensing line 430 may be arranged to be adjacent to the first voltage line 410, apart from the first voltage line 410. For example, when the first connection portion 414 of the first voltage line 410 has a bent shape as illustrated in FIG. 4, the first sensing line 430 may likewise have the bent shape and may extend in parallel to the first connection portion 414. Thus, a short circuit with other signal lines arranged in the peripheral area PA may be effectively avoided.

Figure 7:
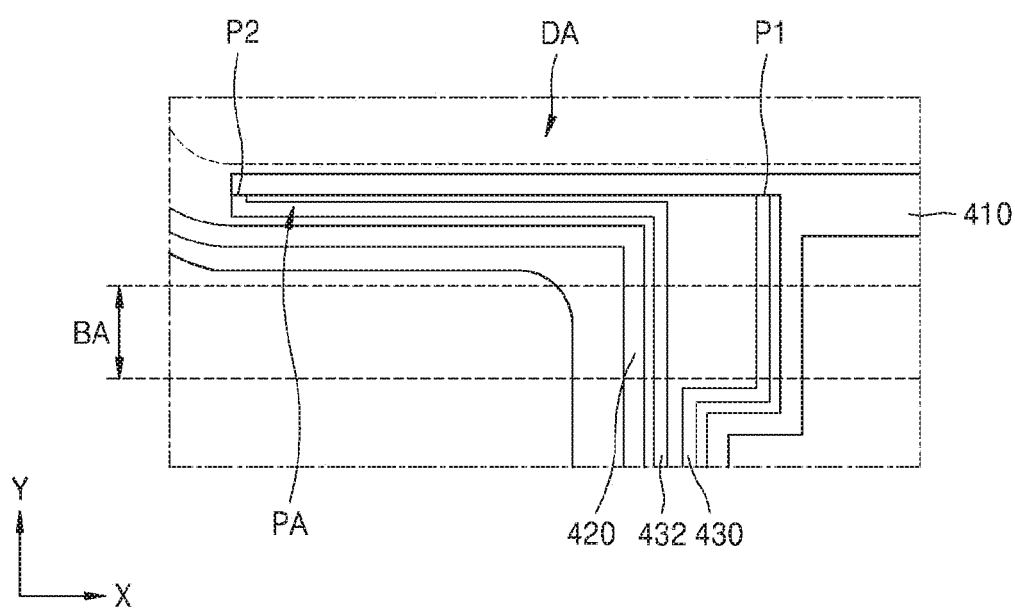
FIG. 7 is a schematic plan view of another example of the region A of FIG. 2.

FIG. 7 is a schematic plan view of another example of the region A of FIG. 2.

Referring to FIG. 7, the peripheral area PA may include the bending area BA between the pad area PADA and the display area DA, and the first voltage line 410 and the second voltage line 420 supplying driving power to the organic light-emitting device 300 (FIG. 3), and the first sensing line 430 and a second sensing line 432 for measuring a voltage of at least the first voltage line 410 may be arranged in the peripheral area PA. The first voltage line 410, the second voltage line 420, and the first sensing line 430 may be the same as the first voltage line 410, the second voltage line 420, and the first sensing line 430 described in FIGS. 5 and 6, and their descriptions will not be repeated.

The second sensing line 432 may be connected to the first voltage line 410 at a different location from the first sensing line 430 and may measure a voltage of the first voltage line 410. An end of the second sensing line 432 may be connected to the first voltage line 410 to form the second contact P2, and the second contact P2 may be more adjacent to an edge of the substrate 100 than the first contact P1. For example, the second contact P2 may be at an end of the first main voltage line 412. The end of the first main voltage line 412 is an area in which a voltage drop (or an IR drop) due to the first voltage line 410 may be the greatest, and thus, since the second contact P2 is at the end of the first main voltage line 412, a value of the ELVDD supplied to the display area PA may be relatively more accurately measured.

The second sensing line 432 may be on the same layer as the first sensing line 430. Thus, the second sensing line 432 may have the same structure as the source electrode 215 (FIG. 3) and the drain electrode 217 (FIG. 3). In addition, to minimize a length of the second sensing line 432, the second sensing line 432 may be arranged to be more adjacent to the second voltage line 420, apart from the second voltage line 420, than to the first voltage line 410, as illustrated in FIG. 7. That is, the second sensing line 432 may extend from the second contact P2 toward the pad area PADA, in parallel to the second voltage line 420.

Figure 8:
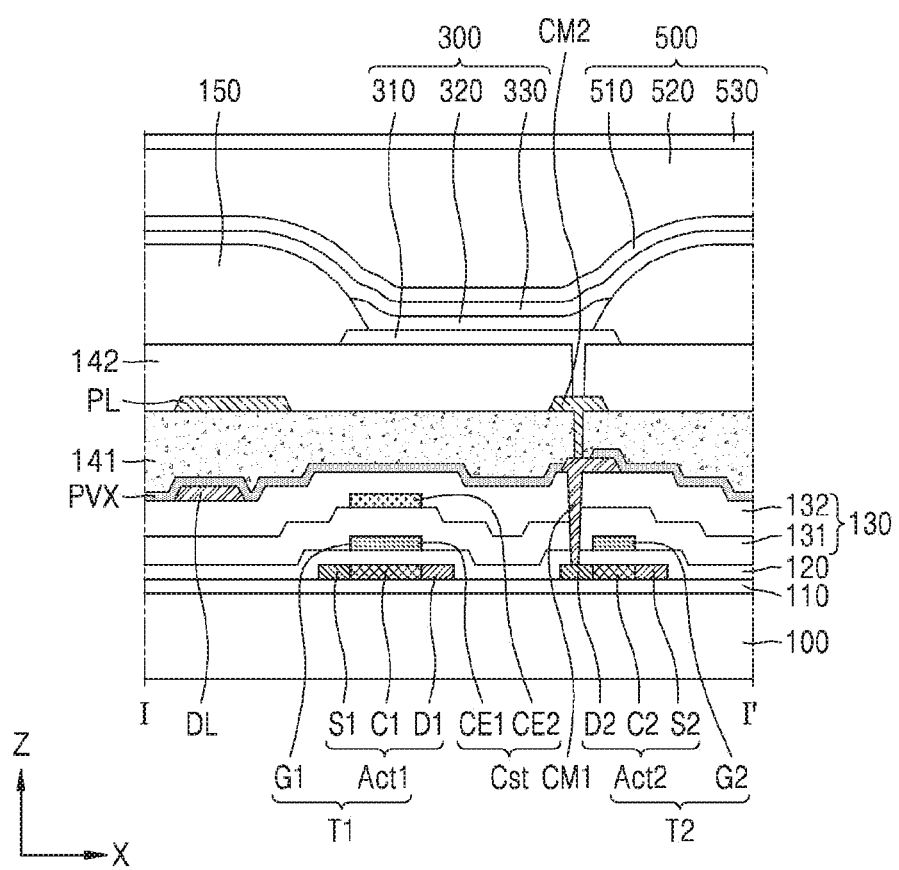
FIG. 8 is a schematic cross-sectional view of another example of the section I-I' of FIG. 2.
Figure 9:
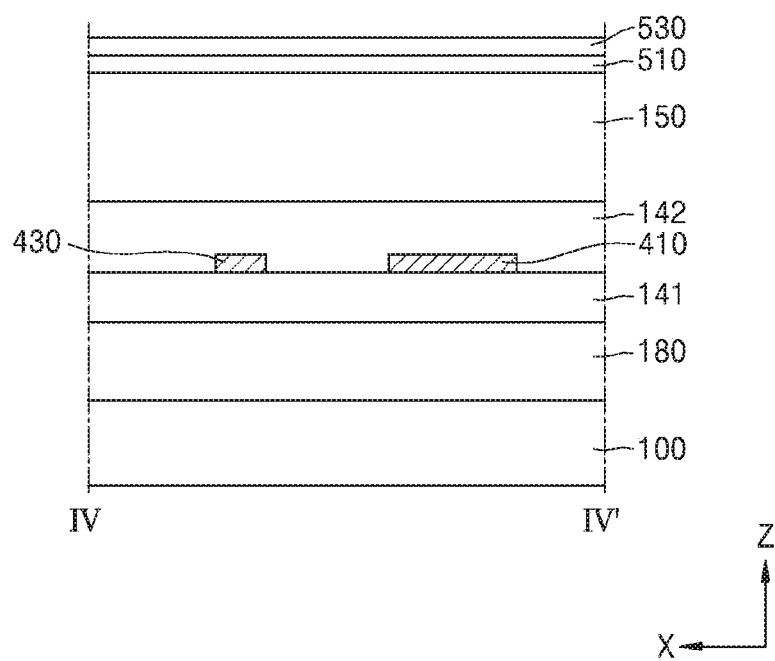
FIG. 9 is a schematic cross-sectional view of another example of the section IV-IV' of FIG. 4.

FIG. 8 is a schematic cross-sectional view of another example of the section I-I' of FIG. 2, and FIG. 9 is a schematic cross-sectional view of another example of the section IV-IV' of FIG. 4.

First, referring to FIG. 8, the organic light-emitting device 300 may be electrically connected to a first thin film transistor T1, a second thin film transistor T2, and a storage capacitor Cst. The first thin film transistor T1 may include a first semiconductor layer Act1 and a first gate electrode G1, and the second thin film transistor T2 may include a second semiconductor layer Act2 and a second gate electrode G2.

The first semiconductor layer Act1 and the second semiconductor layer Act2 may include amorphous silicon, polycrystalline silicon, an oxide semiconductor, or an organic semiconductor material. The first semiconductor layer Act1 may include a channel area C1, and a source area S1 and a drain area D1 at both sides of the channel area C1, and the second semiconductor layer Act2 may include a channel area C2, and a source area S2 and a drain area D2 at both sides of the channel area C2.

The source areas S1 and S2 and the drain areas D1 and D2 of the first and second semiconductor layers Act1 and Act2 may be understood as source electrodes and drain electrodes of the first and second thin film transistors T1 and T2.

The first gate electrode G1 and the second gate electrode G2 may be arranged to overlap the channel area C1 of the first semiconductor layer Act1 and the channel area C2 of the second semiconductor layer Act2, respectively, with the gate insulating layer 120 between the first and second gate electrodes G1 and G2 and the channel areas C1 and C2. Each of the first and second gate electrodes G1 and G2 may be a single layer or multiple layers including a conductive material including at least one of Mo, Al, Gu, and Ti.

In addition, FIG. 8 illustrates that the first gate electrode G1 and the second gate electrode G2 are arranged on the same layer. However, exemplary embodiments are not limited thereto. According to another exemplary embodiment, the first gate electrode G1 and the second gate electrode G2 may be arranged on different layers from each other. Also, FIG. 8 illustrates that the first and second gate electrodes G1 and G2 are a top-gate type arranged on the first and second semiconductor layers Act1 and Act2, respectively. However, exemplary embodiments are not limited thereto. According to another exemplary embodiment, the first and second gate electrodes G1 and G2 may be a bottom gate type arranged below the first and second semiconductor layers Act1 and Act2, respectively.

The storage capacitor Cst may include a first storage capacitor plate CE1 and a second storage capacitor plate CE2 overlapping each other. The first and second storage capacitor plates CE1 and CE2 may include a low-resistance conductive material including at least one of Mo, Al, Cu, and Ti.

The storage capacitor Cst may overlap the first thin film transistor T1, and the first thin film transistor Ti may be a driving thin film transistor. FIG. 8 illustrates that the storage capacitor Cst may be arranged to overlap the first thin film transistor T1 so that the first storage capacitor plate CE1 is the first gate electrode G1 of the first thin film transistor T1. However, exemplary embodiments are not limited thereto. According to another exemplary embodiment, the storage capacitor Cst may be arranged not to overlap the first thin film transistor T1.

The buffer layer 110 may be arranged between the substrate 100 and the first and second thin film transistors T1 and T2. The buffer layer 110 may include an inorganic insulating material. For example, the buffer layer 110 may be a single layer or multiple layers including at least one of SiON, $SiO_X$, and $SiN_X$.

The gate insulating layer 120 may be arranged between the first and second gate electrodes G1 and G2 and the first and second semiconductor layers Act1 and Act2. The gate insulating layer 120 may include an inorganic insulating material. For example, the gate insulating layer 120 may be a single layer or multiple layers including at least one of SiON, $SiO_X$, and $SiN_X$.

The first and second thin film transistors T1 and T2 may be covered by the interlayer insulating layer 130. FIG. 8 illustrates that the interlayer insulating layer 130 includes a first interlayer insulating layer 131 and a second interlayer insulating layer 132. The first interlayer insulating layer 131 may be arranged right above the first and second thin film transistors T1 and T2, and/or the first storage capacitor plate CE1. The second interlayer insulating layer 132 may be arranged above the second storage capacitor plate CE2. Each of the first and second interlayer insulating layers 131 and 132 may be a single layer or multiple players including at least one of SiON, $SiO_X$, and $SiN_X$. According to an exemplary embodiment, the first interlayer insulating layer 131 may be a single layer including $SiN_X$, and the second interlayer insulating layer 132 may be multiple layers including $SiN_X$ and $SiO_X$.

A data line DL may be arranged on the interlayer insulating layer 130. The data line DL may be electrically connected to the first thin film transistor T1 and may provide a data signal to the first thin film transistor T1. The data line DL may be a single layer or multiple layers including at least one of Al, Cu, Ti, and an alloy thereof. According to an exemplary embodiment, the data line DL may be a triple layer of Ti/Al/Ti.

The data line DL may be covered by an inorganic protection layer PVX. The inorganic protection layer PVX may be a single layer or multiple layers including $SiN_X$ or $SiO_X$. Although not shown, the inorganic protection layer PVX may cover and protect some wires exposed in the peripheral area PA. Wires formed in the same process as the data line DL may be exposed in some areas (for example, a portion of the peripheral area PA) of the substrate 100. The exposed wires may be damaged by an etchant used for patterning the pixel electrode 310 to be described below. However, according to the present exemplary embodiment, since the inorganic protection layer PVX covers the data line DL and at least some of the wires simultaneously formed with the data line DL, damage to the wires during the process of patterning the pixel electrode 310 may be prevented.

A driving voltage line PL may provide a driving signal to the second thin film transistor T2. The driving voltage line PL and the data line DL may be arranged on different layers from each other. In this specification, that "A and B are arranged on different layers from each other" indicates that at least one insulating layer is between A and B so that one of A and B is arranged below the at least one insulating layer and the other is arranged above the at least one insulating layer. A first planarization insulating layer 141 may be arranged between the driving voltage line PL and the data line DL.

The driving voltage line PL may be a single layer or multiple layers including at least one of Al, Cu, Ti, and an alloy thereof. According to an exemplary embodiment, the driving voltage line PL may be a triple layer of Ti/Al/Ti. FIG. 8 illustrates that the driving voltage line PL is arranged only on the first planarization insulating layer 141. However, exemplary embodiments are not limited thereto. According to another exemplary embodiment, the driving voltage line PL may be connected to a lower additional voltage line (not shown), which is formed with the data line DL, via a penetration hole (not shown) in the first planarization insulating layer 141, to reduce resistance.

A second planarization insulating layer 142 may cover the driving voltage line PL. The first and second planarization insulating layers 141 and 142 may include an organic material. The organic material may include an imide-based polymer, a general-purpose polymer, such as polymethylmethacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, and a blend thereof.

The organic light-emitting device 300 including the pixel electrode 310, the opposite electrode 330, and the intermediate layer 320 between the pixel electrode 310 and the opposite electrode 330 and including an emission layer may be arranged on the second planarization insulating layer 142.

The pixel-defining layer 150 may be arranged on the pixel electrode 310. The pixel-defining layer 150 may have an opening corresponding to each pixel, that is, an opening to expose a central portion of at least the pixel electrode 310, thereby defining the pixels. Also, the pixel-defining layer 150 may increase a distance between an edge of the pixel electrode 310 and the opposite electrode 330, thereby preventing an arc, etc., from occurring between the edge of the pixel electrode 310 and the opposite electrode 330. The pixel-defining layer 150 may include an organic material, such as PI or HMDSO.

The pixel electrode 310 may be electrically connected to a pixel circuit, for example, a pixel circuit including the first and second thin film transistors T1 and T2 and the storage capacitor Cst, through a first connection metal CM1 and a second connection metal CM2.

The intermediate layer 320 may include a low molecular-weight material or a high molecular-weight material. When the intermediate layer 320 includes a low-molecular weight material, the intermediate layer 320 may have a structure in which an HIL, an HTL, an EML, an ETL, or an EIL is stacked as a single-layered or a multi-layered structure, and may include various organic materials, such as CuPc, N,N'-Di (naphthalene-1-yl)-N,N'-diphenyl-benzidine, tris-8-hydroxyquinoline aluminum (Alq3), etc. The HIL, the HTL, the EML, the ETL, the EIL, etc. may be formed by using a vapor deposition method.

When the intermediate layer 320 includes a high-molecular weight material, the intermediate layer 320 may generally have a structure including an HTL and an EML. Here, the HTL may include PEDOT, and the EML may include a polymer material, such as a PPV-based polymer material and a polyfluorene-based polymer material. Structures of the intermediate layer 320 are not limited thereto and may vary. For example, the intermediate layer 320 may include a layer that is integral throughout the plurality of pixel electrodes 310 and may include layers patterned to correspond to the plurality of pixel electrodes 310, respectively.

The opposite electrode 330 may be arranged to cover the display area DA. That is, the opposite electrode 330 may be integrally formed to cover the plurality of organic light-emitting devices 300.

The encapsulation layer 500 may be above the opposite electrode 330. The encapsulation layer 500 may protect the organic light-emitting device 300 from external water or oxygen. To this end, the encapsulation layer 500 may have a shape extending not only to the display area DA in which the organic light-emitting device 300 is arranged, but also to the peripheral area PA outside the display area DA. The encapsulation layer 500 may include the first inorganic encapsulation layer 510, the organic encapsulation layer 520, and the second inorganic encapsulation layer 530 sequentially stacked.

The first inorganic encapsulation layer 510 may be formed on the opposite electrode 330 and may include silicon oxide, silicon nitride, and/or silicon oxynitride. The first inorganic encapsulation layer 510 may be formed along a structure therebelow.

The organic encapsulation layer 520 may be on the first inorganic encapsulation layer 510 and may have a sufficient thickness so that an upper surface of the organic encapsulation layer 520 may be substantially flat. The organic encapsulation layer 520 may include one or more materials selected from the group consisting of PET, PEN, PC, PI, polyethylene sulfonate, polyoxymethylene, polyarylate, and hexamethyldisiloxane.

The second inorganic encapsulation layer 530 may cover the organic encapsulation layer 520 and may include silicon oxide, silicon nitride, and/or silicon oxynitride. The first inorganic encapsulation layer 510 and the second inorganic encapsulation layer 530 may have a greater area than the organic encapsulation layer 520 and may contact each other outside the organic encapsulation layer 520. That is, due to the first inorganic encapsulation layer 510 and the second inorganic encapsulation layer 530, the organic encapsulation layer 520 may not be exposed to the outside.

As shown above, the encapsulation layer 500 may include the first inorganic encapsulation layer 510, the organic encapsulation layer 520, and the second inorganic encapsulation layer 530, and thus, via this multiple structure, even if cracks occur in the encapsulation layer 500, the cracks may not be connected between the first inorganic encapsulation layer 510 and the organic encapsulation layer 520, or between the organic encapsulation layer 520 and the second inorganic encapsulation layer 530. Via this, forming of a path through which water or oxygen from the outside penetrates into the display area DA may be prevented or minimized.

FIG. 9 illustrates a section of the same location as the section IV-IV' of FIG. 4, when the display apparatus 10 (FIG. 2) has the structure as illustrated in FIG. 8. In FIG. 9, the substrate 100, the organic material layer 180, the pixel-defining layer 150, the first inorganic encapsulation layer 510, and the second inorganic encapsulation layer 530 are the same as illustrated and described in FIG. 4, and thus, their descriptions will not be repeated. Compared to FIG. 4, in FIG. 9, the first voltage line 410 and the first sensing line 430 are on the first planarization insulating layer 141. That is, the first voltage line 410 and the first sensing line 430 may be formed on the same layer as the driving voltage line PL (FIG. 8) and may be a single layer or multiple layers including at least one of Al, Cu, Ti, and an alloy thereof. According to an exemplary embodiment, the first voltage line 410 and the first sensing line 430 may be a triple layer of Ti/Al/Ti.

In addition, although not shown, when the display apparatus 10 (FIG. 2) has the same structure as the structure illustrated in FIG. 8, the display apparatus 10 may further include the second sensing line 432 (FIG. 7) as illustrated in FIG. 7. In this case, the second sensing line 432 (FIG. 7) may be formed on the same layer as the driving voltage line PL (FIG. 8) or the data line DL (FIG. 8).

As described above, according to the one or more of the above exemplary embodiments, the value of the actual voltage supplied to the organic light-emitting device may be accurately measured, and thus, a driving defect due to a voltage drop (or an IR drop) may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate comprising a display area, a peripheral area surrounding the display area, a pad area in the peripheral area, and a bending area between the display area and the pad area;
   a thin film transistor disposed in the display area and an organic light-emitting device electrically connected to the thin film transistor;
   a first voltage line disposed between a side of the display area and the pad area, and in the peripheral area, the first voltage line supplying a first voltage to the organic light-emitting device; and
   a first sensing line disposed in the peripheral area, the first sensing line measuring the first voltage of the first voltage line,
   wherein an end of the first sensing line is connected to the first voltage line to form a first contact between the bending area and the display area.

2. The display apparatus of claim 1, wherein the first voltage line comprises a first main voltage line arranged to correspond to the side of the display area, and a first connection portion extending across the bending area from the first main voltage line toward the pad area, and
   the first contact is in the first main voltage line.

3. The display apparatus of claim 2, further comprising a second sensing line in the peripheral area, the second sensing line measuring the first voltage of the first voltage line at a location different from a location of the first sensing line.

4. The display apparatus of claim 3, wherein an end of the second sensing line is connected to the first voltage line to form a second contact, and
the second contact is closer to an edge of the substrate than the first contact.

5. The display apparatus of claim 4, wherein the second contact is at an end of the first main voltage line.

6. The display apparatus of claim 2, wherein the first sensing line is apart from the first connection portion, has the same shape as the first connection portion, and extends from the first contact toward the pad area, in parallel to the first connection portion.

7. The display apparatus of claim 2, further comprising a second voltage line in the peripheral area, the second voltage line supplying a second voltage to the organic light-emitting device,
wherein the second voltage line comprises a second main voltage line corresponding to both ends of the first main voltage line and surrounding the display area, except for the side of the display area, and a second connection portion protruding from an end of the second main voltage line and extending across the bending area.

8. The display apparatus of claim 7, wherein the organic light-emitting device comprises a pixel electrode, an opposite electrode, and an intermediate layer disposed between the pixel electrode and the opposite electrode and comprising an emission layer, and
the second voltage line is electrically connected to the opposite electrode.

9. The display apparatus of claim 1, wherein an inorganic insulating layer is stacked on the substrate,
the inorganic insulating layer comprises a groove, the groove being formed by removing a portion of the inorganic insulating layer at a location corresponding to the bending area,
an organic material layer disposed in the groove, and
the first sensing line being disposed on the organic material layer in the bending area.

10. The display apparatus of claim 1, wherein the thin film transistor comprises a semiconductor layer, a gate electrode, a source electrode, and a drain electrode, and
the first sensing line is on the same layer as the source electrode and the drain electrode of the thin film transistor.

11. A display apparatus comprising:
a substrate comprising a display area, a peripheral area surrounding the display area, a pad area in the peripheral area, and a bending area between the display area and the pad area;
a first voltage line disposed in the peripheral area, the first voltage line being provided between a side of the display area and the pad area;
a second voltage line surrounding the display area, except for the side of the display area; and
a first sensing line in the peripheral area, the first sensing line measuring a first voltage of the first voltage line,
wherein the first voltage line is connected to an end of the first sensing line to form a first contact, and
the first contact is closer to the display area than the bending area.

12. The display apparatus of claim 11, wherein a thin film transistor and a display device electrically connected to the thin film transistor are disposed in the display area,
the thin film transistor comprises a semiconductor layer, a gate electrode, a source electrode, and a drain electrode, and
the first sensing line and the first voltage line are on the same layer as the source electrode and the drain electrode.

13. The display apparatus of claim 11, wherein the first voltage line comprises a first main voltage line arranged to correspond to the side of the display area, and a first connection portion extending across the bending area from the first main voltage line toward the pad area, and
the first contact is in the first main voltage line.

14. The display apparatus of claim 13, further comprising a second sensing line disposed in the peripheral area, the second sensing line measuring the first voltage of the first voltage line at a location different from a location of the first sensing line,
wherein an end of the second sensing line is connected to the first voltage line to form a second contact at a location different from a location of the first contact.

15. The display apparatus of claim 14, wherein the second contact is closer to an edge of the substrate than the first contact.

16. The display apparatus of claim 14, wherein the second contact is at an end of the first main voltage line.

17. The display apparatus of claim 14, wherein the second sensing line is closer to the second voltage line than to the first voltage line and extends from the second contact toward the pad area in parallel to the second voltage line.

18. The display apparatus of claim 11, wherein a thin film transistor and a display device electrically connected to the thin film transistor are disposed in the display area,
the display device comprises a pixel electrode, an opposite electrode, and an intermediate layer between the pixel electrode and the opposite electrode and comprising an emission layer, and
the second voltage line is electrically connected to the opposite electrode.

19. The display apparatus of claim 11, wherein a first thin film transistor, a second thin film transistor, and a display device electrically connected to the second thin film transistor are disposed in the display area,
an interlayer insulating layer, a first planarization insulating layer, and a second planarization insulating layer are disposed between the first and second thin film transistors and the display device,
a data line and a driving voltage line which are at respective layers different from each other and have the first planarization insulating layer disposed therebetween, and the data line and the driving voltage line are disposed between the first and second thin film transistors and the display device,
the data line provides a data signal to the first thin film transistor, and the driving voltage line provides a driving signal to the second thin film transistor, and
the first sensing line is on the same layer as the driving voltage line.

20. The display apparatus of claim 11, wherein
an inorganic insulating layer is stacked on the substrate,
the inorganic insulating layer comprises a groove, the groove is formed by removing a portion of the inorganic insulating layer at a location corresponding to the bending area,
an organic material layer is disposed in the groove, and the first sensing line is disposed on the organic material layer in the bending area.

\* \* \* \* \*